United States Patent
Thompson et al.

(10) Patent No.: US 10,036,089 B2
(45) Date of Patent: Jul. 31, 2018

(54) METHODS OF DEPOSITING A METAL ALLOY FILM

(71) Applicant: Applied Materials, Inc., Santa Clara, CA (US)

(72) Inventors: David Thompson, San Jose, CA (US); Jeffrey W. Anthis, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 837 days.

(21) Appl. No.: 14/316,126

(22) Filed: Jun. 26, 2014

(65) Prior Publication Data
US 2015/0004316 A1 Jan. 1, 2015

Related U.S. Application Data

(60) Provisional application No. 61/839,521, filed on Jun. 26, 2013.

(51) Int. Cl.
  *C23C 16/08* (2006.01)
  *C23C 16/18* (2006.01)
  *C23C 16/455* (2006.01)

(52) U.S. Cl.
  CPC .............. *C23C 16/08* (2013.01); *C23C 16/18* (2013.01); *C23C 16/45553* (2013.01)

(58) Field of Classification Search
  CPC .... C23C 16/08; C23C 16/18; C23C 16/45553
  USPC ........................................................ 427/253
  See application file for complete search history.

(56) References Cited

U.S. PATENT DOCUMENTS

| | | |
|---|---|---|
| 4,330,433 A | 5/1982 | Wristers |
| 4,734,514 A * | 3/1988 | Melas .................. C07C 391/00 556/70 |
| 5,186,718 A | 2/1993 | Tepman et al. |
| 6,077,775 A | 6/2000 | Stumborg et al. |
| 7,214,599 B2 | 5/2007 | Kauzlarich et al. |
| 7,780,758 B2 | 8/2010 | Park et al. |
| 8,192,866 B2 | 6/2012 | Golightly et al. |
| 2010/0260935 A1 * | 10/2010 | Kato .................... C23C 16/402 427/255.28 |
| 2011/0159186 A1 * | 6/2011 | Chakchung Yu . C23C 16/45548 427/255.5 |
| 2012/0322250 A1 * | 12/2012 | Ganguli ............ H01L 21/28088 438/585 |
| 2013/0115383 A1 * | 5/2013 | Lu ........................ C23C 16/455 427/535 |

FOREIGN PATENT DOCUMENTS

| | | |
|---|---|---|
| CN | 101859694 A | 10/2010 |
| JP | 2005-503984 | 2/2005 |
| WO | 2007133837 A2 | 11/2007 |

OTHER PUBLICATIONS

PCT International Preliminary Report on Patentability in PCT/US2014/044369, dated Jan. 7, 2016, 7 pages.
PCT International Search Report and Written Opinion in PCT/US2014/044369, dated Oct. 16, 2014, 10 pages.
Extended European Search Report in EP 14818363 dated Oct. 21, 2016, 8 pages.
Dey, et al., "Mechanism for the atomic layer deposition of copper using diethylzinc as the reducing agent—a Density Functional Theory study using gas phase molecules as a model", Journal of Physical Chemistry A vol. 116 Issue 35, 2012, 8893-8901.

* cited by examiner

*Primary Examiner* — Alexander M Weddle
(74) *Attorney, Agent, or Firm* — Servilla Whitney LLC

(57) ABSTRACT

Provided are methods of depositing films comprising exposing at least a portion of a substrate to a metal precursor to provide a first metal on the substrate and an organometallic reducing agent to deposit a second metal on the substrate to form a mixture or alloy of the first metal and the second metal. Exposure to the metal precursor and organometallic reducing agent can be in either order or simultaneously.

13 Claims, No Drawings

METHODS OF DEPOSITING A METAL ALLOY FILM

CROSS-REFERENCE TO RELATED APPLICATIONS

This application claims priority to U.S. Provisional Application No. 61/839,521, filed Jun. 26, 2013, the entire disclosure of which is hereby incorporated by reference herein.

BACKGROUND

Embodiments of the invention generally relate to reducing agents and methods for depositing a film on a substrate surface. In particular, embodiments of the invention are directed to reducing agents and methods for depositing a titanium film on a substrate.

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. For example, TiAl is a film that has been used in planar high-k metal gates in the 45 nm to 20 nm nodes.

Metal films (e.g., titanium) can be deposited by chemical vapor deposition (CVD) or cyclical deposition processes. For example, a substrate can be exposed to a mixture of a titanium organometallic precursor and a reducing agent. The reaction f the titanium organometallic precursor and the reducing agent results in the deposition of metallic titanium on the substrate surface. In a cyclical process, such as atomic layer deposition (ALD), the substrate is exposed to, for example, a titanium organometallic precursor which adsorbs or chemisorbs to the surface of the substrate. The titanium organometallic complex can be reduced to metallic titanium with a suitable reducing agent. In ALD processes, the metal precursor and reducing agent are separately exposed to the substrate to avoid the gas phase reactions used in a CVD process. Atomic layer deposition processes can result in the controlled deposition of a film having a known thickness.

The deposition of titanium alloy films is often accomplished by reduction of a titanium precursor containing chloride with an organometallic reducing agent. One common process for depositing a TiAl alloy involves the reaction of titanium tetrachloride ($TiCl_4$) with an organoaluminum precursor to provide a film comprising titanium and aluminum. However, there is a need in the art for precursors and methods for depositing different intermetallic films.

SUMMARY

One or more embodiments of the invention are directed to methods of depositing an alloy film in a processing chamber. A substrate is positioned within the processing chamber. At least a portion of the substrate is exposed to a metal halide precursor to provide a first metal on the substrate. Unreacted metal halide precursor is purged from the processing chamber. The portion of the substrate surface is exposed to an organometallic reducing agent comprising a second metal different from the first metal to deposit the second metal on the substrate resulting in an alloy of the first metal and the second metal.

Additional embodiments of the invention are directed to methods of depositing an alloy film on a substrate in a processing chamber. The substrate is positioned within the processing chamber. A metal halide precursor to provide a first metal and an organometallic reducing agent comprising a second metal different from the first metal are simultaneously flowed into the processing chamber to deposit an alloy film comprising the first metal and the second metal.

Further embodiments of the invention are directed to methods of depositing an alloy film on a substrate in a processing chamber. The substrate is positioned within the processing chamber. A metal halide precursor to provide a first metal is flowed into the processing chamber to contact a portion of the substrate. An organometallic reducing agent comprising a second metal different from the first metal is flowed into the processing chamber to contact a portion of the substrate. The metal halide and organometallic reducing agent are simultaneously flowed into different regions of the processing chamber and are separated by an inert gas curtain to prevent gas phase reaction of the metal halide and organometallic reducing agent.

DETAILED DESCRIPTION

A "substrate" as used herein, refers to any substrate or material surface or film formed on a substrate upon which processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, dielectrics, high-k dielectrics and other conductive materials, depending on the application. Substrates include, without limitation, semiconductor wafers. Substrates may be exposed to a pretreatment process, for example, to polish, etch, reduce, oxidize, hydroxylate, anneal and/or bake the substrate surface. In addition to film processing directly on the surface of the substrate itself, any of the film processing steps disclosed may also be performed on an underlayer formed on the substrate as disclosed in more detail below, and the term "substrate surface" is intended to include such underlayer as the context indicates. The term "substrate surface" can refer to the entire substrate surface or a portion of the substrate surface.

Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

In accordance with various embodiments of the invention, provided are methods related to the deposition of metal alloys which may be suitable as N-metal films. In one or more embodiments, the alloy film has a tunable work function.

Film deposition can be by any suitable technique, including but not limited to, chemical vapor deposition (CVD) and atomic layer deposition (ALD). In one or more embodiments, the films provided comprise one or more of TiAl, TaAl or HfAl with low carbon content.

In one or more embodiments, the films are deposited using an ALD, CVD or PVD process. In embodiments relating to a CVD process, the substrate may be exposed to more than one precursor continuously simultaneously, or substantially simultaneously, as appropriate. As used herein, the term "substantially simultaneously" means that a majority of the flow of one component overlaps with the flow of another, although there may be some time where they are not co-flowed.

In other embodiments, films are deposited using an atomic layer deposition (ALD) process. Therefore, in one embodiment, contacting the substrate surface with two or more precursors occurs sequentially or substantially sequentially. As used herein, "substantially sequentially" means that a majority of the flow of one component does not coincide with the flow of another, although there may be some overlap.

In exemplary embodiments of an ALD process, a first chemical precursor ("A") is pulsed or flowed, for example, $TiCl_4$, to the substrate surface in a first half reaction. Excess reactants and the reaction by-products are removed, typically by an evacuation-pump down and/or by a flowing inert purge gas. Then a precursor "B", for example an aluminum organometallic complex, is delivered to the surface, wherein the precursors of the first half reaction are reacted with the "B" precursor, creating a mixed metal film. The "B" co-reactant also forms self-saturating bonds with the underlying reactive species to provide a saturating second half reaction. A second purge period is typically utilized to remove unused reactants and the reaction by-products. A "C" precursor may then be flowed to react with the underlying species, and then excess "C" precursor removed. The "A," "B," and "C" precursors and purge gases can then again be flowed.

Some embodiments of the invention are directed to methods of depositing an alloy film. A substrate is positioned within a processing chamber (e.g., an ALD or CVD chamber). At least a portion of the substrate is exposed to a metal precursor, or a first metal precursor, to provide a first metal on the substrate. Reference to "a portion of the substrate" can mean any size portion including the entire substrate surface. Unreacted metal precursor, or first metal precursor is purged from the processing chamber. The portion of the substrate that was exposed to the metal precursor is then exposed to an organometallic reducing agent to deposit a second metal on the substrate resulting in a mixture or alloy of metals being deposited. The metal in the metal precursor and the metal in the organometallic reducing agent can be the same metal or different metals. In some embodiments, the first metal, from the metal precursor and the second metal, from the organometallic reducing agent, are different, resulting in the deposition of a mixed metal or alloy film. For example, the metal precursor can contain titanium and the organometallic reducing agent can contain aluminum, resulting in the formation of an titanium aluminum alloy film. In some embodiments, the organometallic reducing agent, or more specifically, the unreacted organometallic reducing agent and reaction by products are purged from the processing chamber.

The metal precursor can be any suitable compound including any suitable metal atom. Suitable metal atoms include, but are not limited to transition metals, group 3 through group 6 transition metals. In some embodiments, the metal of the metal precursor is one or more of titanium, tantalum, tungsten and aluminum. In one or more embodiments, the metal of the metal precursor is titanium. The metal precursor can be a compound capable of being reduced to deposit a metal on the substrate. For example, the metal precursor can be a metal halide. In one or more embodiments, the metal halide is one or more of a chloride, fluoride, bromide, iodide and mixtures thereof. In some embodiments, the metal halide comprises titanium tetrachloride. Suitable metal halides include transition metal halides, group 3 through group 6 transitional metal halides. For some group 6 metal halides, the metal halide precursor can comprise an unsaturated metal halide (e.g., $WCl_5$).

The organometallic reducing agent can be any suitable compound capable of reducing the metal precursor to deposit the metal. The metal in the organometallic reducing agent can be any suitable metal including the same metal as that of the metla precursor. In some embodiments, the metal precursor has a first metal and the organometallic reducing agent has a second metal, where both the first metal and second metal are the same metal. For example, both metals can be titanium, resulting in the deposition of a substantially pure titanium film. As used in this specification and the appended claims, the term "substantially pure" means that there is less than about 5% impurities on an atomic basis, or less than about 2% impurities on an atomic basis, or less than about 1% impurities on an atomic basis. In some embodiments, the metal precursor has a first metal and the organometallic reducing agent has a second metal different from the first metal. For example, the first metal can be titanium and the second metal can be aluminum, resulting in the deposition of a mixed titanium-aluminum film or titanium-aluminum alloy.

The metal in the organometallic precursor, also referred to as the second metal, can be any suitable metal. Suitable metals include, but are not limited to, germanium, indium, tin, antimony, thallium, lead, bismuth, zinc, aluminum, gallium and mixtures thereof.

The organic component of the organometallic reducing agent can have a marked impact on, for example, the reduction potential of the reducing agent and the rate of reaction with the first metal. In some embodiments, the organometallic reducing agent comprises a metal alkyl. In one or more embodiments, the alkyl of the second metal can include one or more of dimethyl-metal hydride, diethylhydrido-metal, methyldihydro-metal, and an alkyl metal hydrides of the formula $[(C_xH_y)_{z-a}MH_a]_n$, wherein x has a value of 1 to 3, y has a value of 2x+1, z has a value of 2 to 5, a has a value of 1 to 2, and n has a value of 1 to 4. In some embodiments, the alkyl of the second metal comprises an amine. The organometallic reducing agent can be any suitable organometallic reducing agent. The organometallic reducing agent of some embodiments comprises one or more of tetraethyl tin, trimethyl indium, trimethyl gallium, trimethyl aluminum, alanes, metal alanes (e.g., aluminum alane) and diethyl zinc.

Exposure of the substrate to the first metal (e.g., a metal halide) can be separate from or at the same time as the exposure to the organometallic reducing agent. In some embodiments, exposure to the first metal precursor at least partially overlaps with the exposure of the substrate to the organometallic reducing agent. As used in this specification and the appended claims, the term "at least partially overlaps" means that both the metal precursor and the organometallic reducing agent are flowed into the processing chamber to the substrate surface at the same time for at least some portion of the processing period. For example, in a traditional CVD process, both the metal precursor and the organometallic reducing agent might be flowed into the processing chamber simultaneously and allowed to mix/react in the gas phase prior to deposition on the substrate surface. In a less traditional method, the metal precursor and the organometallic reducing agent can be flowed separately into the processing chamber so that only one of the gases is contacting the substrate for a period of time, and both gases are mixing or contacting the substrate for a separate period of time.

In some embodiments, the substrate is sequentially exposed to the metal precursor (e.g., a metal halide) and the organometallic reducing agent. Sequential exposure means that a specific portion of the substrate is only exposed to one of the metal precursor and the organometallic reducing agent at any given time. The specific portion of the substrate is then exposed to the other of the metal precursor and the organometallic reducing agent at a different time. For example, in a spatial atomic layer deposition process, separate portions of the substrate surface are exposed to streams of the metal precursor and the organometallic reducing agent. The substrate is moved, relative to the gas distribution assembly (or vice versa), so that each individual portion of the substrate is exposed to both gas streams. In some embodiments, the metal precursor and organometallic reducing agent are simultaneously flowed into different regions of the processing chamber. These separate gas flows can be separated by an inert gas curtain to prevent gas phase reaction of the metal precursor and organometallic reducing agent. The inert gas curtain can be any suitable gas flow, vacuum flow or combination of gas flow and vacuum flow to keep the reactive gases separate. For example, a gas curtain can comprise a vacuum flow, a purge gas flow, and a second vacuum flow to ensure that reactive gases on either side of the gas curtain cannot react in the gas phase.

The order of exposure to the metal precursor and the organometallic reducing agent can vary depending on the particular process. In some embodiments, the substrate, or portion of the substrate, is exposed to the metal precursor before being exposed to the organometallic reducing agent. In one or more embodiments, the substrate, or portion of the substrate, is exposed to the organometallic reducing agent before being exposed to the metal precursor. In one or more embodiments, the substrate, or portion of the substrate, is exposed to the metal precursor and the organometallic precursor at the same time.

The methods described herein may also include additional sub-processes. In one or more embodiments, the methods further comprise soaking the deposited film with an alloying agent. For example, a mixed metal film comprising the first metal and the second metal can be exposed to an alloying agent to form an alloy. As used herein, "soak" or "soaking", and the like, refer to processes wherein a substrate, or portion thereof, is exposed to a reactant gas, and the gas reacts with the surface, but does not deposit a layer. Some embodiments further comprise soaking the alloy film with an alloying agent, wherein the alloying agent comprises one or more of SiH4, GeH4, trimethylgallium, and $B_2H_6$.

The film deposited by the described methods may have lower carbon contamination than a similar film deposited by other methods. For example, an alloy film deposited by the claimed methods contains less than about 20% carbon.

The alternating exposure of the surface to reactants is continued until the desired thickness film is reached, which for most anticipated applications would be approximately in the range of 5 Å to 100 Å, and more specifically from about 15 Å, 20 Å, 25 Å or 30 Å to about 45 Å, 50 Å, 55 Å or 60 Å. It will be understood that the reactants and purge gases can flow simultaneously, and the substrate and/or gas flow nozzle can oscillate such that the substrate is sequentially exposed to the reactant and purge gases as desired. Of course, the aforementioned ALD cycles are merely exemplary of a wide variety of ALD process cycles in which a deposited layer is formed by alternating layers of precursors and/or co-reactants.

It should be noted that these sequences are only exemplary, and there are many variants as discussed above. The purge step removes any excess precursor, byproducts and other contaminants within the processing chamber. The carrier gas, the purge gas, or other process gas may contain nitrogen, hydrogen, argon, neon, helium, or combinations thereof.

The precursors and/or reactants may be in a state of gas or vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas are not be required.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Time-domain ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of depositing an alloy film, the method comprising:
   positioning a substrate within a processing chamber;
   exposing at least a portion of the substrate to a metal halide precursor to provide a first metal on the substrate;
   purging unreacted metal halide precursor from the processing chamber; and
   exposing the portion of the substrate to an organometallic reducing agent comprising a second metal different from the first metal to deposit the second metal on the substrate resulting in an alloy of the first metal and the second metal, the organometallic reducing agent comprising an alkyl of the second metal, the second metal selected from the group consisting of In, Sb, Tl, Pb, Bi and mixtures thereof, the alkyl of the second metal comprises one or more of dimethyl-metal hydride, diethylhydrido-metal, methyldihydro-metal, and an alkyl metal hydrides of the formula $[(C_xH_y)_{z-a}MH_a]_n$, wherein x has a value of 1 to 3, y has a value of 2x+1, z has a value of 2 to 5, a has a value of 1 to 2, and n has a value of 1 to 4.

2. The method of claim 1, wherein the metal halide comprises titanium tetrachloride.

3. The method of claim 1, wherein exposure of the substrate to the metal halide at least partially overlaps with exposure of the substrate to the organometallic reducing agent.

4. The method of claim 1, further comprising purging the organometallic reducing agent.

5. The method of claim 1, wherein the substrate is sequentially exposed metal halide and the organometallic reducing agent.

6. The method of claim 5, wherein the substrate is exposed to the metal halide before being exposed to the organometallic reducing agent.

7. The method of claim 5, wherein the substrate is exposed to the organometallic reducing agent before being exposed to the metal halide.

8. The method of claim 1, further comprising soaking the alloy film with an alloying agent, wherein the alloying agent comprises one or more of $SiH_4$, $GeH_4$, trimethylgallium, and $B_2H_6$.

9. The method of claim 1, wherein the alloy film contains less than 20% carbon.

10. A method of depositing an alloy film, the method comprising:
positioning a substrate within a processing chamber; and
simultaneously flowing a metal halide precursor to provide a first metal and an organometallic reducing agent comprising a second metal different from the first metal into the processing chamber to deposit an alloy film comprising the first metal and the second metal, the organometallic reducing agent comprising an alkyl of the second metal, the second metal selected from the group consisting of In, Sb, Tl, Pb, Bi and mixtures thereof, the alkyl of the second metal comprises one or more of dimethyl-metal hydride, diethylhydrido-metal, methyldihydro-metal, and an alkyl metal hydrides of the formula $[(C_xH_y)_{z-a}MH_a]_n$, wherein x has a value of 1 to 3, y has a value of 2x+1, z has a value of 2 to 5, a has a value of 1 to 2, and n has a value of 1 to 4.

11. The method of claim 10, wherein the metal halide comprises titanium tetrachloride.

12. The method of claim 10, wherein the alloy film contains less than 20% carbon.

13. A method of depositing an alloy film, the method comprising:
positioning a substrate within a processing chamber; and
flowing a metal halide precursor to provide a first metal into the processing chamber to contact a portion of the substrate, the first metal comprising one or more of titanium, tantalum, tungsten or aluminum; and
flowing an organometallic reducing agent comprising a second metal different from the first metal into the processing chamber to contact a portion of the substrate, the organometallic reducing agent comprising an alkyl of the second metal, the second metal selected from the group consisting of In, Sb, Tl, Pb, Bi and mixtures thereof, the alkyl of the second metal comprises one or more of dimethyl-metal hydride, diethylhydrido-metal, methyldihydro-metal, and an alkyl metal hydrides of the formula $[(C_xH_y)_{z-a}MH_a]_n$, wherein x has a value of 1 to 3, y has a value of 2x+1, z has a value of 2 to 5, a has a value of 1 to 2, and n has a value of 1 to 4,
wherein the metal halide and organometallic reducing agent are simultaneously flowed into different regions of the processing chamber and are separated by an inert gas curtain to prevent gas phase reaction of the metal halide and organometallic reducing agent, and
wherein the alloy film is substantially pure with less than about 1% impurities on an atomic basis.

* * * * *